ns707B2

(12) United States Patent
Gilardi et al.

(10) Patent No.: US 7,728,707 B2
(45) Date of Patent: Jun. 1, 2010

(54) SPLIT-COIL MAGNET ARRANGEMENT WITH IMPROVED MECHANICAL CONSTRUCTION

(75) Inventors: Raffaele Gilardi, Zurich (CH); Stefan Schneider, Urdorf (CH); Robert Schauwecker, Zurich (CH); Pierre-Alain Bovier, Zurich (CH)

(73) Assignee: Bruker Biospin AG, Faellanden (CH)

( * ) Notice: Subject to any disclaimer, the term of this patent is extended or adjusted under 35 U.S.C. 154(b) by 492 days.

(21) Appl. No.: 11/882,151

(22) Filed: Jul. 31, 2007

(65) Prior Publication Data
US 2008/0252402 A1  Oct. 16, 2008

(30) Foreign Application Priority Data
Aug. 30, 2006  (DE)  .................. 10 2006 040 687

(51) Int. Cl.
  H01F 1/00  (2006.01)
  H01F 3/00  (2006.01)
  H01F 7/00  (2006.01)
  H01F 5/00  (2006.01)
  H01F 6/00  (2006.01)
  G01V 3/00  (2006.01)
(52) U.S. Cl. ................ 335/296; 335/216; 335/297; 335/299; 324/307; 324/318; 324/319; 505/879
(58) Field of Classification Search .............. 335/216, 335/296–301; 505/879, 892, 893, 898; 324/307, 324/309, 318, 319, 320, 322; 336/155
See application file for complete search history.

(56) References Cited
U.S. PATENT DOCUMENTS
4,587,504 A  5/1986  Brown 5,291,169 A  3/1994  Ige
(Continued)

FOREIGN PATENT DOCUMENTS
EP  0 971 240  1/2000
JP  2001-230114  8/2001

OTHER PUBLICATIONS

Claudet, G. et al. "A 10 tesla cryomagnetic system for neutron scattering experiments", Cryogenics, Dec. 1981.
(Continued)

Primary Examiner—Elvin G Enad
Assistant Examiner—Mohamad A Musleh
(74) Attorney, Agent, or Firm—Paul Vincent

(57) ABSTRACT

A magnet arrangement with a magnet coil system (M) with two coil systems (C, D) that are each arranged in a container (B1, B2) positioned around the z axis and that are axially mechanically separated by a split (G), wherein each coil system (C, D) comprises a first (C1, D1) and a second coil section system (C2, D2), wherein the first coil section systems (C1, D1) are exposed to attractive magnetic forces showing toward the split (G) ($K_{C1}$, $K_{D1}$) and the second coil section systems (C2, D2), to repulsive magnetic forces showing away from the split (G) ($K_{C2}$, $K_{D2}$), and containing in the split (G) at least one mechanical structure that withstands compressive loads (E1, E2) and that supports a part of the attractive magnetic forces ($K_{C1}$, $K_{D1}$), is characterized in that, in the split (G) within the dimensions of the containers (B1, B2), a mechanical structure (H1) is provided that mechanically withstands tensile loads in the z direction, supports a part of the repulsive magnetic forces in the axial direction ($K_{C2}$, $K_{D2}$), is connected to the containers (B1, B2) and holds them together. With the inventive magnet arrangement, the magnetic forces can be better controlled. At the same time, a low-cost, space and weight saving assembly can be implemented.

23 Claims, 8 Drawing Sheets

U.S. PATENT DOCUMENTS

| | | | | |
|---|---|---|---|---|
| 5,410,287 | A | * | 4/1995 | Laskaris et al. ............. 335/216 |
| 5,448,214 | A | * | 9/1995 | Laskaris ..................... 335/301 |
| 5,517,168 | A | * | 5/1996 | Dorri et al. ................. 335/301 |
| 5,521,571 | A | * | 5/1996 | Laskaris et al. ............. 335/216 |
| 5,545,997 | A | * | 8/1996 | Westphal et al. ............ 324/320 |
| 6,717,408 | B2 | | 4/2004 | Minas |
| 2004/0041673 | A1 | * | 3/2004 | Kakugawa et al. .......... 335/299 |

OTHER PUBLICATIONS

Minas, C. et al. "Structural Design and Analysis of a Cryogen-Free Open Superconducting Magnet for Interventional MRI Applications". IEEE Transactions on Applied Superconductivity vol. 5, No. 2, Jun. 1995.

Laskaris, E. T. et al. "A Cryogen-Free Open Superconducting Magnet for Interventional MRI Applications". IEEE Transactions on Applied Superconductivity, vol. 5, No. 2, Jun. 1995.

* cited by examiner

SPLIT-COIL MAGNET ARRANGEMENT WITH IMPROVED MECHANICAL CONSTRUCTION

This application claims Paris Convention priority of DE 10 2006 040 687.7 filed Aug. 30, 2006 the complete disclosure of which is hereby incorporated by reference.

BACKGROUND OF THE INVENTION

The invention relates to a magnet arrangement with a magnet coil system for generating a magnetic field in the direction of a z axis in a working volume arranged on the z axis around z=0 with two coil systems that are each arranged in a container positioned around the z axis, wherein the containers are mechanically axially separated from each other by a split, wherein the coil systems each include one first coil section system and at least one of the coil systems contains a second coil section system, wherein each coil section system comprises at least one coil body and at least one winding package, wherein the first coil section systems are exposed to magnetic forces acting in the axial direction toward the split, and wherein the second coil section systems are exposed to magnetic forces acting in the axial direction away from the split, wherein these magnetic forces are at least partly mechanically transmitted to the containers, and with at least one mechanical structure that withstands compressive loads, that is arranged in the split, and which supports at least part of the attractive magnetic forces.

Such an arrangement is known from [1].

The uses of such magnet arrangements include various applications. In experiments to study material properties in a magnetic field using neutrons and X-rays, a small split (typically less than 5 cm at the magnet center) between the two coil systems permits direct access to the sample for the neutron or X-ray beam. The sample is positioned in the working volume through a bore along the axis of the magnet arrangement and is irradiated by the neutron or X-ray beam through the split. The neutron or X-ray beam is detected at outside the magnet system after scattering with the sample. To ensure that as many neutrons or photons as possible arrive at the sample and reach the detectors, the size of the mechanical structure that supports the magnetic forces in the split between the coil systems, in particular, in the region of the neutron or X-ray beams, must be minimized and be made of suitable material. In magnets for neutron scattering, thin aluminum rings are often used in the split because aluminum is very transparent to neutrons (typically 3-4% loss per 1 cm of aluminum). It is also known that the structure is formed in the split as wedges or columns. The free space in the split can also be evacuated during operation to prevent unwanted scattering between the neutron or X-ray beam and liquids or gas.

From [2], a magnet arrangement is known whose magnet coil system includes two different superconducting coil systems that are positioned in two vacuum-tight containers filled with liquid helium and axially separated mechanically by a split. The split is 10 mm at the magnet center and increases radially with an aperture angle of +10° and −50 to increase the aperture cross-section for the beam. This magnet arrangement consists exclusively of coils that are exposed to magnetic forces attracting in the axial direction toward the split. This also applies to all other previously implemented magnet arrangements for neutron and X-ray scattering. Each coil is protected with a separate protection element (low resistance) against overheating and high voltages in case of collapse of the superconductivity (quench) during operation. To produce the vertical magnetic field of 10 Tesla efficiently, the containers must have the thinnest walls possible at the split (3 mm of steel). However, the small distance between the two coil systems causes the attractive axial forces between the two coil systems to be especially strong (approximately 250 kN). In the evacuated split between the containers, thin concentric aluminum rings are therefore inserted that support the attractive axial magnetic forces between the two coil systems in the operating state to prevent deformation of the thin containers. In this mechanical structure, there is no joint or weld between the aluminum and the steel (or other materials), so that no problems arise from thermal expansion when the system is cooled down. The two containers are kept together with three tubes made of steel that are also used for liquid coolants and electrical connections. Sometimes, an additional aluminum ring is screwed in the split to the two containers to keep the two containers together when, in the uncharged state, no magnetic forces are present to compensate the weight forces acting on the containers.

A similar mechanical structure in the split of a split-coil magnet arrangement is also known from [3], wherein this structure consists of C-shaped aluminum rings and spacers.

Such mechanical structures in the split can efficiently support the attractive forces between the two coil systems and prevent deformation of the containers. However, such known devices have the disadvantage that only magnetic forces acting toward the split can be handled.

In [4] and [5], a magnet arrangement is described that comprises two coil systems separated by a split with two coil section systems each, wherein the first coil section systems are exposed to magnetic forces acting in the axial direction toward the split, and the second coil section systems to magnetic forces acting away from the split in the axial direction. Such systems are also known from [6], [7], [1]. One application of such arrangements is open superconducting magnets that are used to produce a magnetic field (of typically 1 Tesla) as part of a system for magnetic resonance imaging (MRI). Open magnets are intended to permit lateral access to the patient between the coil systems during MRI imaging. The distance between the two coil systems is typically greater than 50 cm. Usually, only a few rods are positioned in the split between the two coil systems to support the attractive forces.

The magnet arrangement from [4] consists of two identical, superconducting coil systems that are positioned in two containers mechanically axially separated by a split and that are actively cooled (without the use of cryogenic liquids). Each coil system includes three coils. During operation, two coils are subject to a magnetic force acting in the axial direction toward the split. The third coils are subject to a magnet force acting in the axial direction away from the split. The resulting force between the two coil systems during operation is attractive (765 kN). The three coils of a coil system are connected by a rigid structure made of steel. The split contains four rods that separate the two coil systems and support the resulting attractive force. Each coil is protected by its own protection element (antiparallel pairs of diodes) against overheating and high voltages in case of quenching. In the arrangement of [6], two axially separated superconducting coil systems are described, wherein each coil system comprises two coil section systems that carry electric currents in opposite directions and that are exposed to magnetic forces in axially opposed directions. The two coil section systems are connected by a rigid structure that supports the magnetic forces and thus keeps the coil section systems together. The two coil systems are screwed together through four bearing rods that support the resulting attractive magnetic force and keep the two coil systems apart.

In the arrangement [7], there are, in addition to the rigid structure within the container, numerous braces that support the attractive and repulsive magnetic forces of the various coil section systems and prevent deformation of the containers.

In the arrangement from [1], there are two bearing connecting structures between the two coil systems. This arrangement also has rigid structures within the container in which the coil systems are arranged that support the attractive and repulsive magnetic forces of the various coil section systems. The resulting force between the two coil systems is attracting and is supported by the connecting structures that withstand compressive loads. Transportation securement rods are also provided on the side radially outside the container that act against the vibrations and torsions of the magnet system.

Such mechanical structures in the split are suitable for open MRI systems, wherein the distance between the two coil systems is large. To ensure sufficient lateral access to the patient, the connecting structure between the two coil systems must be as space-saving as possible. For that reason, in the known arrangements, the various coil section systems are interconnected by a rigid structure in each coil system, so that only the resulting magnetic force between the coil systems has to be supported by the smallest possible number of space-saving connecting structures in the split. However, such known connecting structures have the disadvantage that the rigid structures they require for connection occupy space inside the containers that is also required for liquid coolants. The containers must therefore have correspondingly large dimensions.

It is the object of the present invention to propose a magnet arrangement wherein the magnetic forces can be controlled while permitting a low-cost, simple, space-saving and weight-saving assembly.

SUMMARY OF THE INVENTION

This object is inventively achieved by including a further mechanical structure in the split, radially within the dimensions of the container, that mechanically withstands tensile loads in the z direction and supports at least part of the magnetic forces acting away from the split in the axial direction, wherein the further mechanical structure is connected to the containers and holds these together, and wherein the maximum tensile stress in the further mechanical structure is between $0.1*Rp_{0.2}$ and $Rp_{0.2}$ of the material used, wherein $Rp_{0.2}$ is the mechanical stress that leads to a plastic deformation of 0.2%.

Whereas in the known arrangements the coil section systems are connected inside a container by means of a rigid structure and thus only a resulting force attracting toward the split acts on the coil systems and therefore also on the containers containing the coil systems, the coil systems and the corresponding containers of the inventive magnet arrangement are locally exposed to forces both acting toward the split and away from the split. The decisive idea of the invention is to arrange structures that withstand both compressive loads and tensile loads in the split. This arrangement permits to support the magnetic forces where they appear. The advantage of the inventive arrangement is that no rigid structure is required inside the container to interconnect the coil section systems in order to support the magnetic forces in the coil systems. The inventive mechanical structure is therefore not exposed to any torque acting inside the coil section systems due to the magnetic forces, but is only subject to compressive or tensile loads. This greatly reduces or eliminates the bending forces acting on the mechanical structure. The inventive arrangement therefore requires less material for the mechanical structure to support the magnetic forces. Moreover, the containers can be smaller because rigid structures inside the containers are no longer required. This makes the inventive magnet arrangement space-saving. In particular, the distance between the magnet center and the cryostat floor can be kept small.

The greatest angular range about the z-axis without contact points between the mechanical structure that withstands tensile loads and the two containers is preferably less than or equal to 180°. The further mechanical structure is therefore contacted with the containers in each half space about the z-axis. The further mechanical structure can also include several individual elements that are mounted independently.

In one especially preferred embodiment, the structure that mechanically withstands tensile loads in the z direction is connected to the containers by a material bond. Such a method permits compact design and the transmission of great forces.

Alternately, it can also be advantageous if the structure that mechanically withstands tensile loads in the z direction is connected to the containers by a form-locked connection. Such an arrangement permits simple assembly and non-destructive disassembly of the structure.

It is especially advantageous if the coil bodies of the first coil section systems and of the second coil section systems, the structure that mechanically withstands tensile loads in the z direction, and the containers are all made of the same material. A great advantage of using the same material is simple producibility of material bonds. A uniform material is also an advantage if the operating temperature differs from the temperature during mechanical assembly, as is the case, for example, for superconducting coils with a low operating temperature. Displacements due to the use of material with different coefficients of thermal expansion and therefore unwanted stresses in the contact regions can thus be avoided.

It can also be an advantage if the coil bodies of the first coil section systems and of the second coil section systems, the structure that mechanically withstands tensile loads in the z direction, and the containers are made of at least two different materials. In such an arrangement, the material with optimum physical properties can be chosen for each element.

A further variant of this embodiment ensures the absolute value of the difference between the relative thermal linear expansion of at least two of the different materials on reaching an operating temperature that differs from the temperature during mechanical assembly of the Magnet arrangement is less than 0.1%. Such a choice of material prevents occurrence of large forces, triggered by thermal displacements in the contact region of materials with different thermal expansion coefficients. Moreover, the properties of the materials of the individual elements can at least be adapted to the requirements, within these limits.

In an advantageous further embodiment, the structure that mechanically withstands tensile loads in the z direction comprises multiple segments that are arranged about the z-axis, wherein the segments are azimuthally spaced with respect to one another. Between the segments there are spaces, preferably slits in a radial direction that have the function of an expansion space. The interfaces of the structures to these spaces are preferably in or parallel to a plane that contains the z-axis. These spaces can open up or close as soon as the parts bordering the space of the structure that can mechanically withstand tensile loads in the z direction are subject to displacements that are perpendicular to the direction of the z-axis. With such an arrangement, forces due to unequal thermal displacements that would otherwise occur at the interfaces between the structure that can mechanically withstand tensile loads and the containers can be avoided.

A further way of avoiding such forces is given by an additional embodiment of the inventive magnet arrangement, wherein the structure that mechanically withstands tensile loads comprises at least one first, non-deformable sub-region and at least a further sub-region that is deformable in a direction perpendicular to the z-axis. The further sub-regions have a lower spring constant than the first sub-regions so that the structure can be tangentially deformed in the further sub-regions as soon as a force is applied to the structure perpendicularly to the direction of the z-axis. Such a structure can be manufactured as a single component.

In a special embodiment, in at least one of the containers, at least one additional structure that withstands bending loads is mechanically connected to the first coil section system and the second coil section system and supports at least part of the attractive and the repulsive magnetic forces. The volume of the structure that can mechanically withstand tensile loads in the split can thus be reduced. This is especially advantageous if the quantity of material in the split is an obstacle to the beam that is intended to pass through the split.

At least one of the second coil section systems is preferably mounted radially outside the corresponding, i.e. located in the same container, first coil section system, and, in the operating state, compensates for at least 50% of the magnetic dipole moment of the two first coil section systems. The second coil section system therefore acts as active stray field shielding for the first coil section system. One second coil section system is preferably mounted radially outside the first coil section system in each of the two containers, which together compensate in the operating state for at least 50% of the magnetic dipole moment of the first coil section systems. In this case, the two coil systems can (but need not) be individually actively shielded, i.e. each second coil section system compensates for at least 50% of the magnetic dipole moment of the associated first coil section system.

In a further advantageous embodiment, the coil systems separated by the split have the same mechanical and geometric structure and are positioned in the containers symmetrically with respect to the plane that is perpendicular to the z axis and intersects it at height z=0. If the coils that have the same geometric structure each carry the same current, the field distribution in the working volume and in the split is symmetrical to plane z=0. Different currents of the equivalent coils can achieve an asymmetrical field distribution. By a symmetrical structure, the number of parts can be reduced, thereby simplifying the manufacturing process.

In an alternate embodiment, the coil systems separated by the split have different mechanical and geometric structures and/or are positioned in the containers asymmetrically with respect to the plane that is perpendicular to the z axis and intersects it at height z=1. In such an arrangement, the field distribution in the working volume and in the split is not symmetrical to plane z=0, if all coils are connected in series and form a single current path. This is a simple way to avoid zero-field nodes in the vicinity of plane z=0 that are unwanted in neutron scattering experiments with polarized neutrons because polarized neutrons would lose their spin orientation there.

The inner radius of at least one of the second coil section systems is preferably greater than 1.3 times the outer radius of one of the first coil section systems. This makes it possible to keep the magnetic forces acting on the second coil section systems small.

Moreover, it is beneficial if the distance between the winding package of one of the second coil section systems and the split is less than 12 mm. If the winding packages of the second coil section systems are positioned axially as close as possible to the split, the magnetic forces acting on them are less than if the second coil section systems were arranged axially far away from the split.

In principle, the inventive magnet arrangement can be implemented with normally conducting coils. However, in the case of normally conducting magnet arrangements, a large quantity of conductor material is required to produce the required field strength. It is therefore advantageous if one or more coil section systems are at least partially superconducting. With superconducting coils, very strong fields can be produced. However, the magnetic forces between the coil section systems are also very large. For this reason, the advantages of the inventive further mechanical structure for supporting these forces are particularly applicable in a superconducting magnet arrangement.

For use in superconducting coil section systems, it is advantageous, if one of the second coil section systems or parts thereof and one of the first coil section systems or parts thereof are connected in series as a protection section, wherein the protection section is connected in parallel with a common protection element. The protection sections protect the superconducting coil section systems in the event of quenching, so that an excessive increase in the magnetic forces acting on the superconducting coils is prevented in that case.

In an advantageous further variant of this embodiment, in the operating state in at least one of the protection sections, the magnetic dipole moments of the parts of the second coil section system compensate for at least 50% of the magnetic dipole moments of the parts of the first coil section system. This also permits strong suppression of unwanted stray fields in the event of quenching.

It is especially advantageous if one of the second coil section systems or parts thereof and one of the first coil section systems or parts thereof are connected together in series inside a superconducting current path and in parallel with a superconducting switch. In such an arrangement, an asymmetrical field distribution in the working volume and in the split with respect to plane z=0 can be implemented, by loading the current paths with different currents. At the same time, this can prevent the magnetic forces from increasing excessively if the paths carry different currents.

In a further variant of this especially preferred embodiment, in the operating state in at least one of the superconducting current paths, the magnetic dipole moments of the parts of the second coil section system compensate for at least 50% of the magnetic dipole moments of the parts of the first coil section system. This permits strong suppression of stray fields even if the paths carry different currents.

The two containers are preferably filled with liquid coolants. Because, due to the inventive further mechanical structure, it is possible to do without a rigid structure inside the containers to interconnect the coil section systems, a greater volume is available for liquid coolants to cool the coil section systems.

It is also advantageous, if a device for active cooling of the containers is provided. In this case, the liquid coolant does not have to be refilled as frequently, if at all. In the inventive arrangement, a cryocooler can be used with a lower power than in the case of the devices known in prior art because the absence of a rigid mechanical structure inside the containers results in less mass which has to be cooled down to the operating temperature of the magnet arrangement.

The inventive magnet arrangement is preferably part of an apparatus for neutron scattering, an apparatus for X-ray scattering or an MRI apparatus. The inventive mechanical structure in the split enables the building of a coil configuration in which the forces on the coil section systems are especially high. These forces have until now placed narrow limits on the design of the magnet arrangement. The inventive arrangement permits, in particular, stronger magnetic fields in the working volume and more efficient active stray field shielding, which is a special benefit in the aforementioned applications.

Further advantages of the invention can be derived from the description and the drawing. Similarly, the characteristics mentioned above and below can be used individually or severally in any combinations. The embodiments shown and described must not be understood as an exhaustive list but are examples provided to describe the invention.

DESCRIPTION OF THE PREFERRED EMBODIMENT

Figure 8:
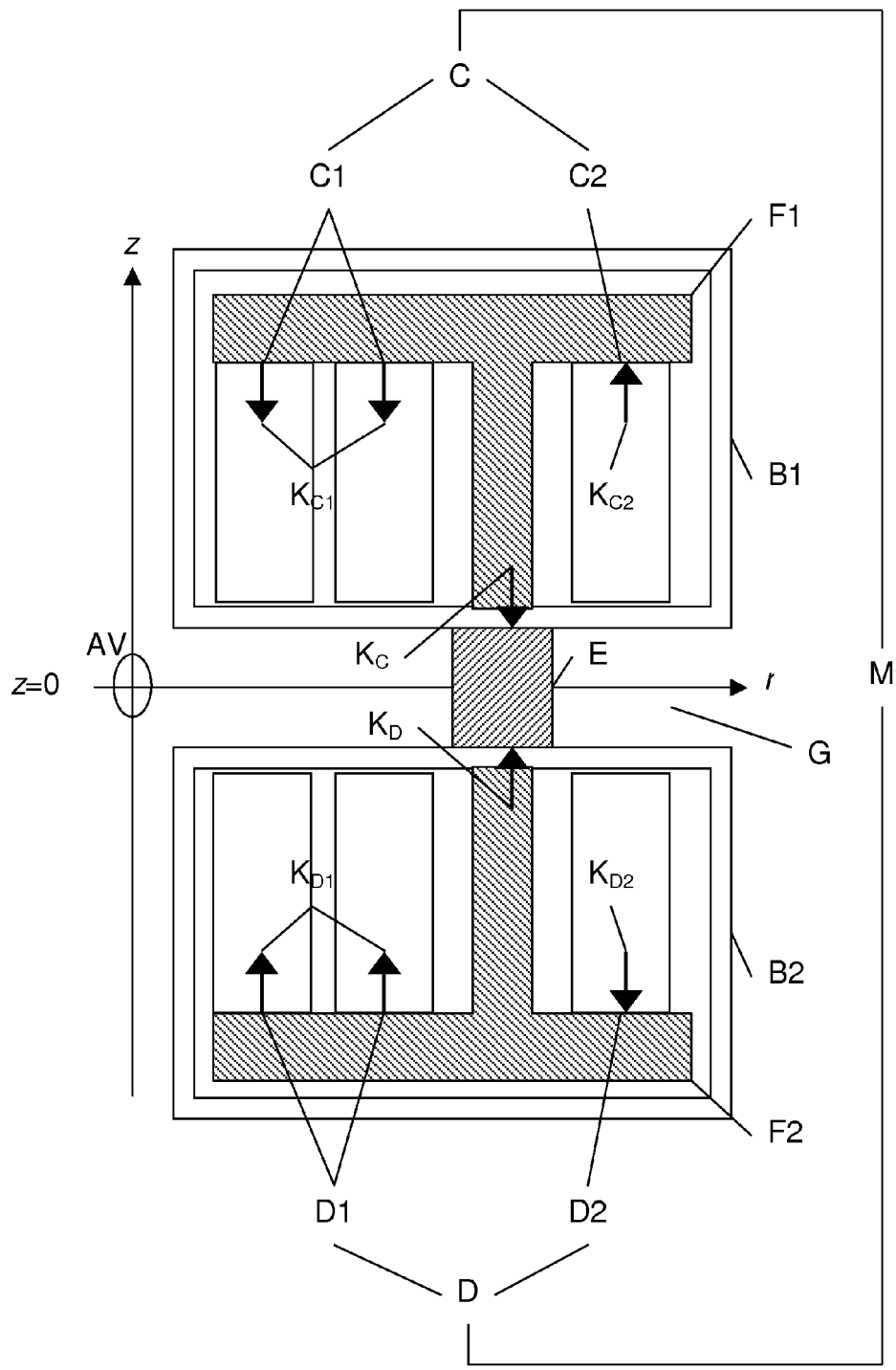
FIG. 8 shows a schematic vertical section through a radial half of a magnet arrangement according to the prior art.

FIG. 8 shows a magnet arrangement according to the prior art that is arranged around a working volume AV and includes a magnet coil system M with two coil systems C, D for producing a magnetic field in the direction of a z axis. The two coil systems C, D are positioned in containers B1, B2 axially mechanically separated by a split G. Each coil system C, D includes a first coil section system C1, D1 and a second coil section system C2, D2. The first coil section system C1, D1 exhibit the same polarization and are exposed to magnetic forces acting toward the split G in the axial direction $K_{C1}$, $K_{D1}$. Each second coil section system C2, D2 is mounted radially outside the corresponding first coil section system C1, D1 and exhibits opposite polarization to the first coil section system C1, D1. The second coil section systems C2, D2 are used, for example, as compensation coils for the stray field of the magnet arrangement. In this arrangement, the second coil section systems C2, D2 are exposed to magnetic forces acting in the axial direction away from the split G $K_{C2}$, $K_{D2}$. The first and second coil section systems C1, C2, D1, D2 are connected by a rigid structure F1, F2 inside the containers B1, B2, which supports the magnetic forces $K_{C1}$, $K_{C2}$, $K_{D1}$, $K_{D2}$. The split G contains a mechanical structure E that supports the resulting attractive magnetic forces $K_C$, $K_D$ between the containers B1, B2. The coil systems C, D separated by the split G have the same mechanical and geometrical structure (C1=D1 and C2=D2) and are arranged symmetrically with respect to plane z=0.

Figure 1:
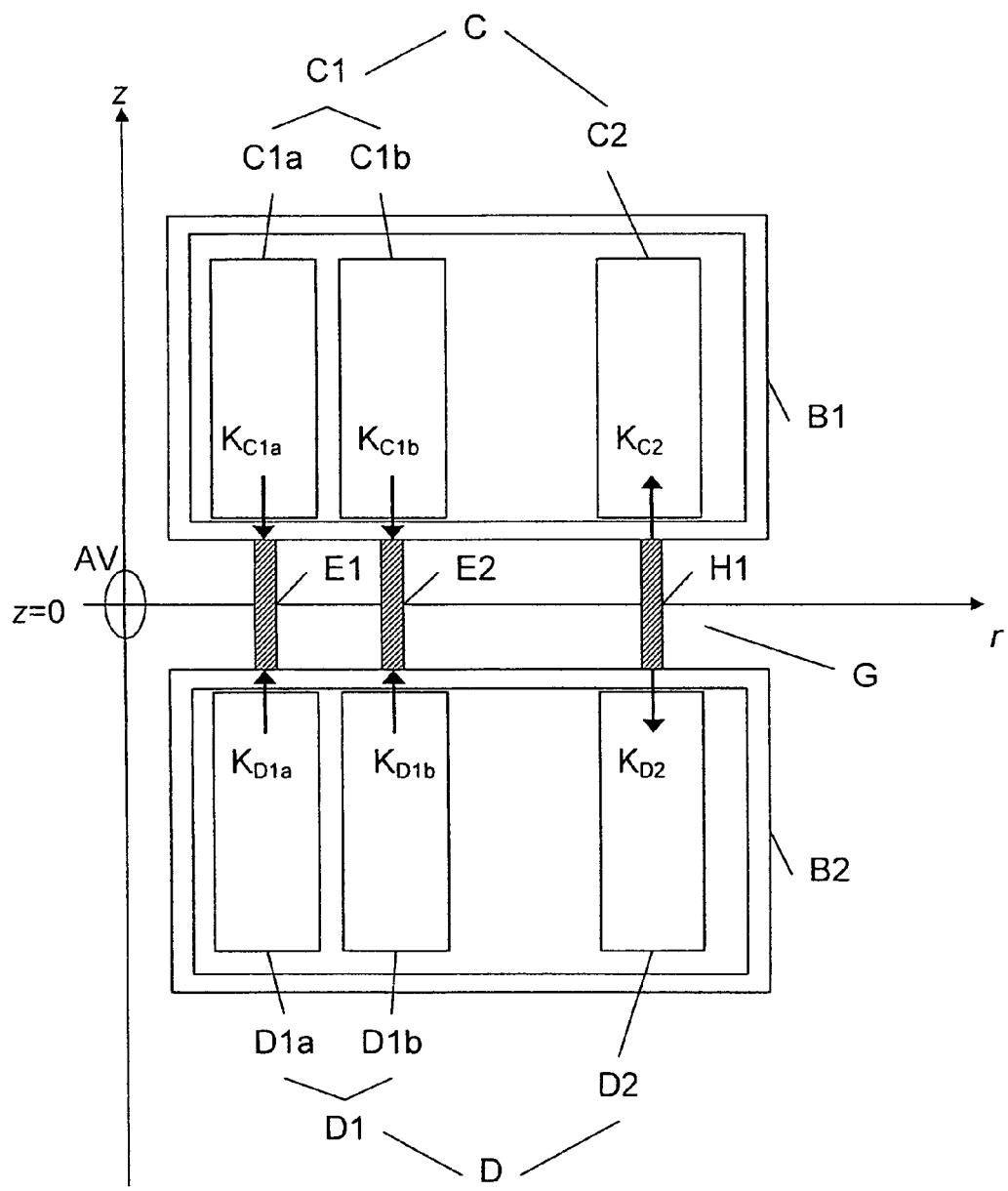
FIG. 1 shows a schematic vertical section through a radial half of a magnet arrangement according to the invention.

FIG. 1 shows an inventive magnet arrangement that does without any rigid structures F1, F2 in the containers B1, B2. In this case, the axial magnetic forces occurring between the coil systems C, D are controlled in a different way. The first coil section systems C1, D1 each include two coil sections C1a, C1b, D1a, D1b. The split G contains two mechanical structures E1, E2 that withstand compressive loads and support the magnetic forces $K_{C1a}$ and $K_{D1a}$ or $K_{C1b}$ and $K_{D1b}$ which are directed toward the split G. Moreover a structure H1 that withstands tensile loads is arranged between the two containers B1, B2, which supports the magnetic forces $K_{C2}$, $K_{D2}$ directed away from the split G while keeping together the two containers B1, B2. The structure H1 that withstands tensile loads can be connected to the containers B1, B2 by a material bond or a form-locked connection while the mechanical structures E1, E2 that withstand compressive loads are preferably inserted in the split between the containers and are not necessarily connected to the containers by a material bond or form-locked connection.

Figure 2:
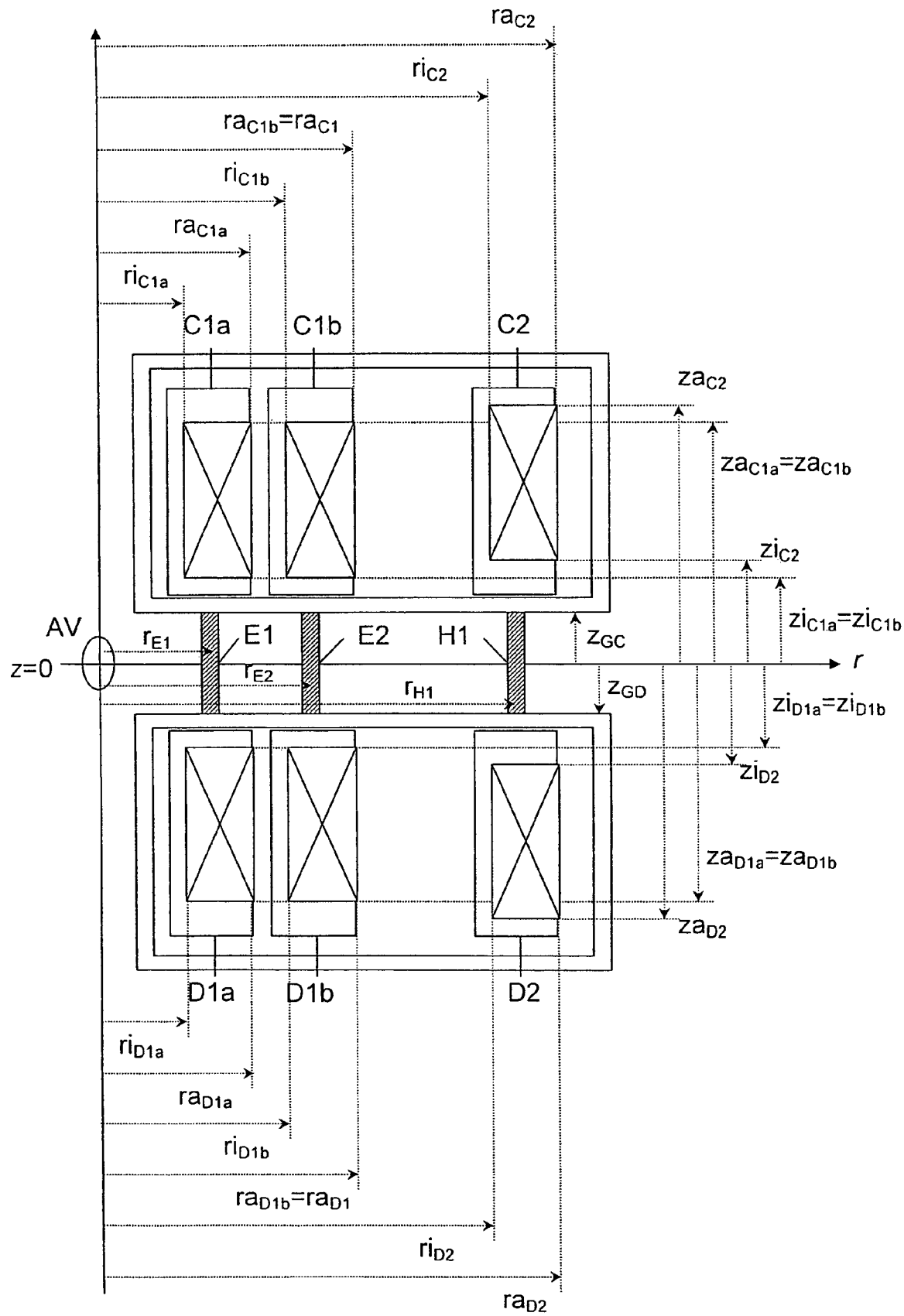
FIG. 2 shows a schematic vertical section through a radial half of a magnet arrangement according to the invention, including the dimensions of the winding packages.

FIG. 2 shows the inventive magnet arrangement with the dimensions of the winding packages. The quantity $ri_{kj}$ or $ra_{kj}$ (k=C, D; j=1a, 1b, 2) denotes the inner or outer radius respectively of the winding package of coil kj. The quantity $zi_{kj}$ or $za_{kj}$ (k=C, D; j=1a, 1b, 2) denotes the distance from z=0 of the lower or upper edge respectively of the winding package of coil kj. The quantities $r_{E1}$, $r_{E2}$, $r_{H1}$ denote the center radii of the structures E1, E2, H1. The quantities $z_{GC}$ or $z_{GD}$ denote the distance between the plane z=0 and the containers B1 or B2. The height of the split G is therefore given by the sum of distances $z_{GC}$, $z_{GD}$ of plane z=0 from containers B1 or B2 respectively. For simplicity's sake, in the embodiment shown in FIG. 2, $z_{GC}$ and $z_{GD}$ are fixed and independent of the distance from the working volume AV. It is possible for the distance $z_{GC}$ and $z_{GD}$ to depend on the distance from the working volume AV. For example, it is usual in an apparatus for neutron and X-ray scattering for the height of the split G to increase with the distance from the working volume AV to permit a degree of divergence of the neutron or X-ray beam.

Figure 3:
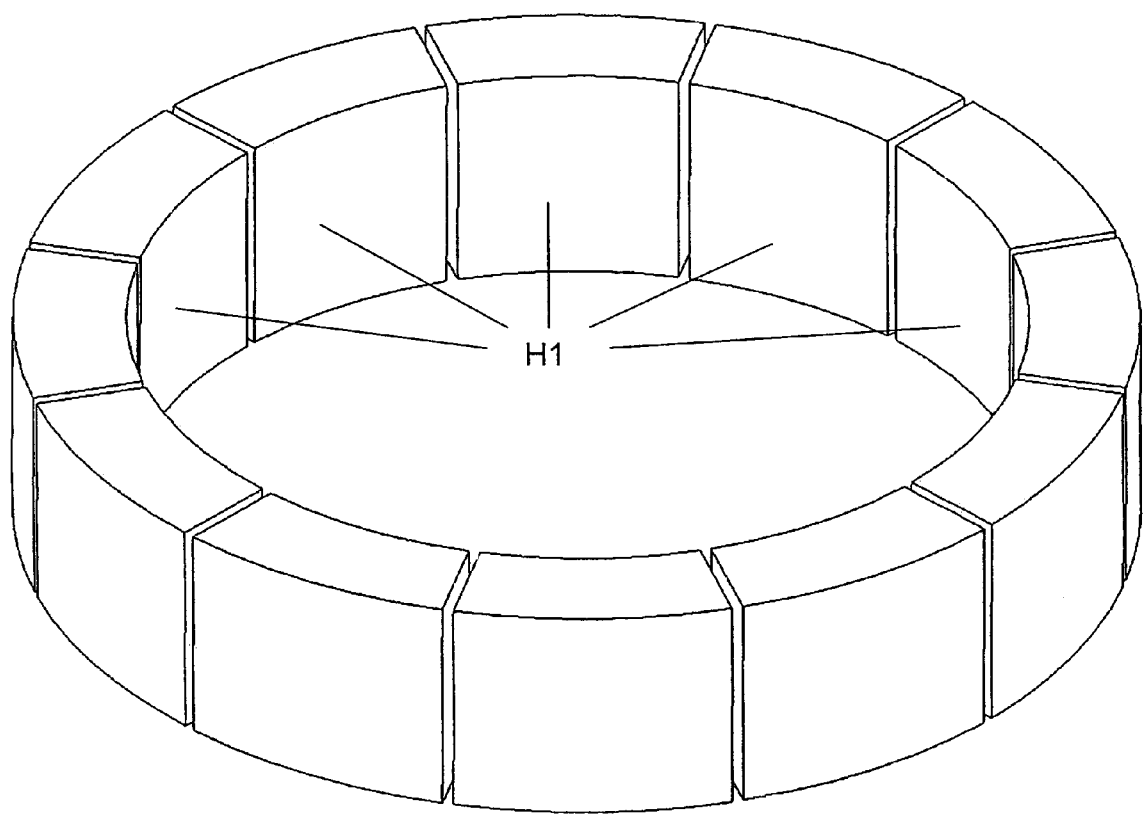
FIG. 3 shows an inventive embodiment of a structure that can mechanically withstand tensile loads in the z direction.

One embodiment of the inventive structure that withstands tensile loads H1 is shown in FIG. 3. The structure that mechanically withstands tensile loads H1 exhibits multiple openings, wherein the interfaces of the structure H1 with the openings are in or parallel to a plane that contains the axis of symmetry of structure H1 (corresponds to the z axis in the assembled state). In the example shown in FIG. 3, the openings form slots in the radial direction that can open up or close as soon as the parts of the structure that can mechanically withstand tensile loads in the z direction H1 bordering the opening are subject to displacement perpendicular to the direction of the z axis. This is the case, in particular, if the magnet arrangement has to be cooled for operation and the coefficients of thermal expansion of structure H1 and containers B1, B2 to which structure H1 is attached differ considerably.

Figure 4:
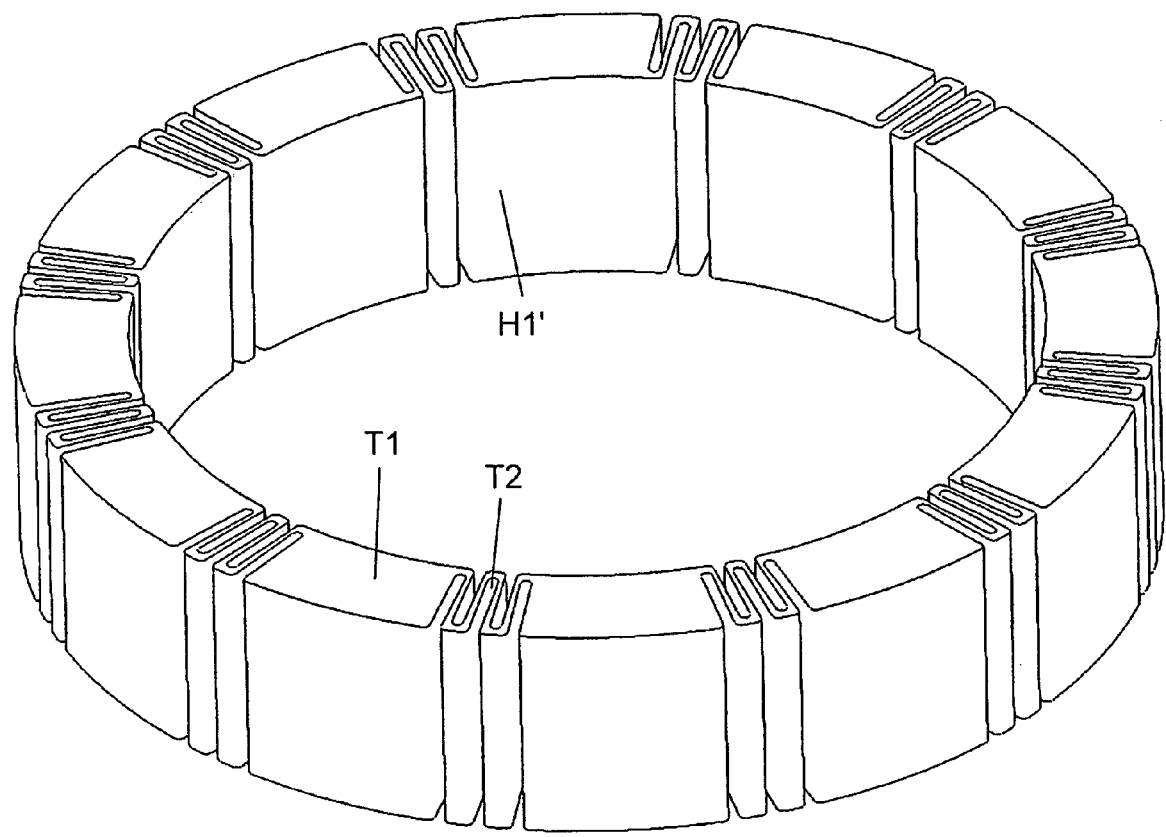
FIG. 4 shows a further inventive embodiment of a structure that can mechanically withstand tensile loads in the z direction.

Another embodiment of an inventive structure H1' is shown in FIG. 4. Structure H1' is formed such that solid sub-regions T1 alternate with tangentially deformable sub-regions T2. The deformable sub-regions T2 of this structure can be deformed as soon as a force acts perpendicularly to the direction of the z-axis parts bordering structure H1. The deformable sub-regions T2 exhibit non-continuous recesses in the radial direction (perpendicular to the z axis), resulting for the sub-regions T2 in a lower spring constant than that of the solid sub-regions T1, even if the structure is made entirely of one material. In the example shown, the non-continuous recesses are arranged alternately on the inside and on the outside of structure H1', resulting in a shape resembling an accordion (meandering shape in the plan view).

Figure 5:
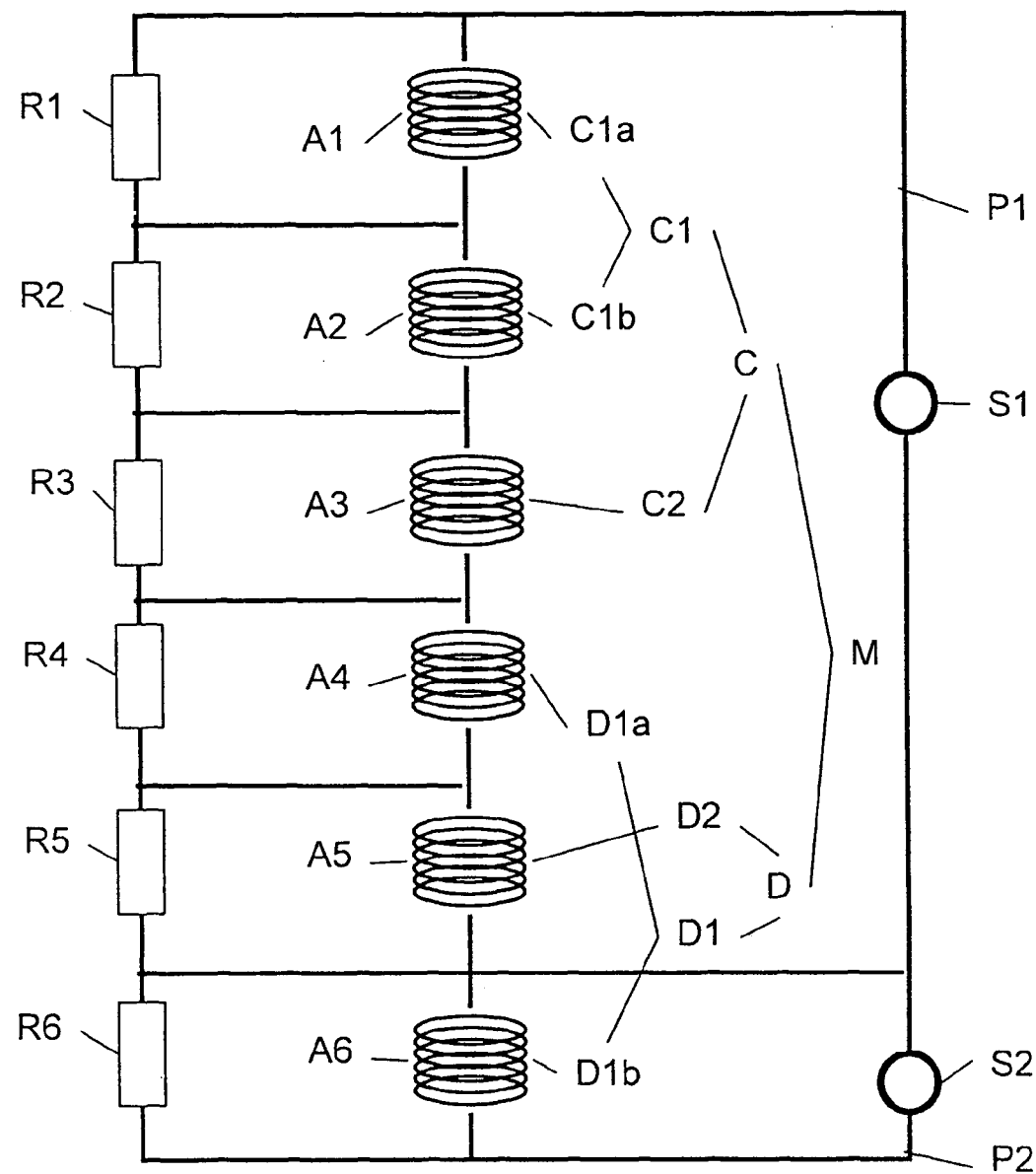
FIG. 5 shows a wiring diagram of a magnet arrangement according to the invention.

FIG. 5 shows a conventional wiring diagram that is suitable for an embodiment of the inventive magnet arrangement with superconducting coils. The arrangement includes two superconducting current paths P1, P2 that together include series-connected coil sections of the coil systems C, D to each of which one superconducting switch is connected in parallel. The second current path P2 includes the coil section D1$b$ and switch S2. The first current path P1 includes the other coil sections C1$a$, C1$b$, C2, D1$a$, D2 and switch S1. Each coil C1$a$, C1$b$, D1$a$, D1$b$, C2, D2 is protected by its own protection element R1, R2, R3, R4, R5, R6 against overheating and high voltages in case of collapse of superconductivity (quenching) during operation. In particular, six protection sections A1, A2, A3, A4, A5, A6 are therefore included.

Figure 6:
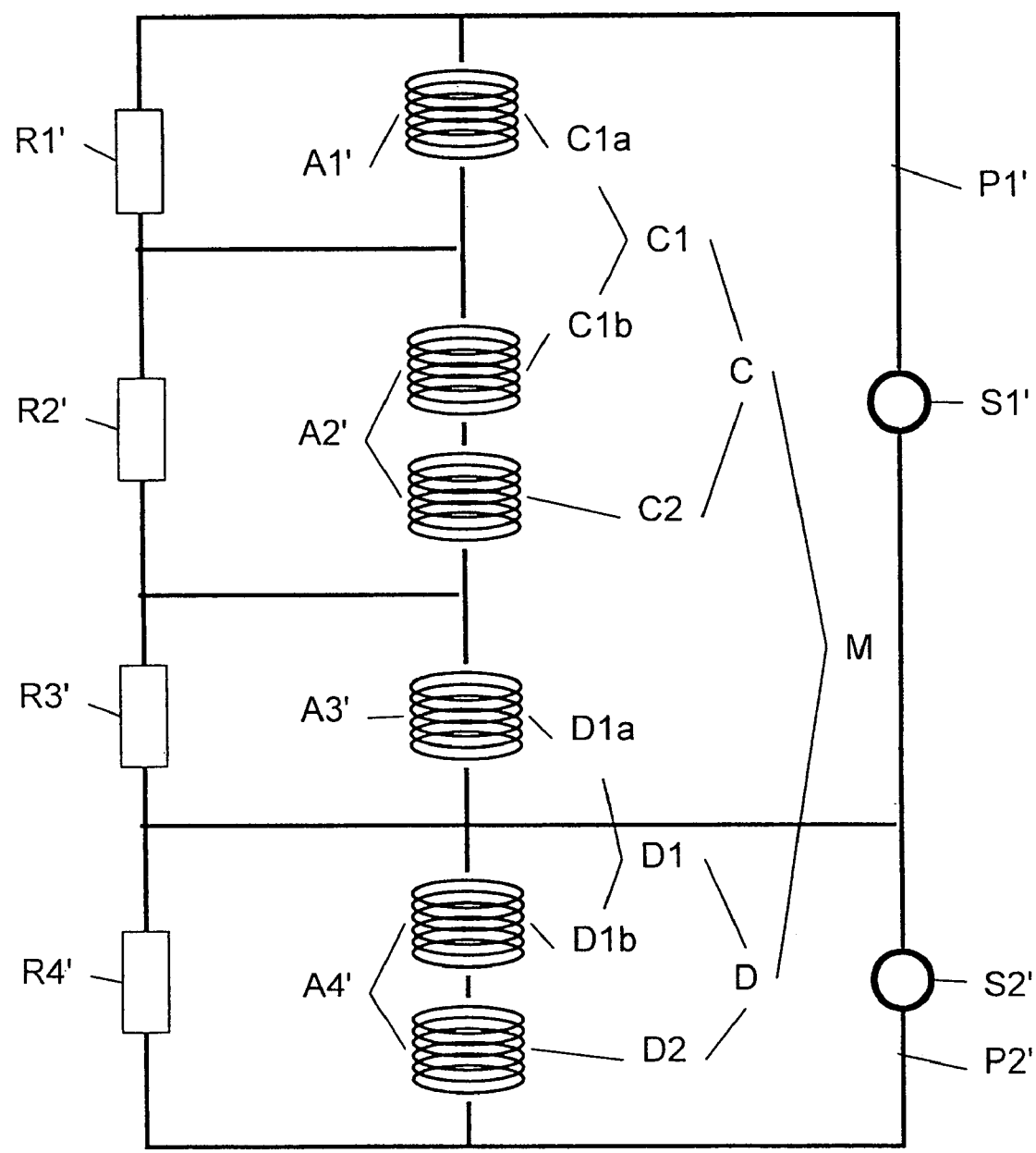
FIG. 6 shows an especially advantageous wiring diagram of a magnet arrangement according to the invention.

An especially advantageous wiring diagram is shown in FIG. 6. The arrangement also includes two superconducting current paths P1', P2' that include series-connected coil sections of the coil systems C, D and a parallel-connected superconducting switch. The second current path P2' includes the coil sections D1$b$ and D2 and switch S2', the first current path P1' the other coil sections C1$a$, C1$b$, D1$a$, C2 and switch S1'. The magnet coil system is, in this case, divided into four protection sections A1', A2', A3', A4' that include parts of a first coil section system C1, D1 and/or a second coil section system C2, D2. Each protection section A1', A2', A3', A4' is connected in parallel with one protection element R1', R2', R3', R4'. The first protection section A1' consists of coil section C1$a$ of the first coil section system C1. The second protection section A2' consists of coil section C1$b$ of the first coil section system C1 and the second coil section system C2. The third protection section A3' consists of the coil section D1$a$ of the first coil section system D1. The fourth protection section A4' consists of the coil section D1$b$ of the first coil section system D1 and the second coil section system D2. Unlike the wiring diagram shown in FIG. 5, the protection sections A1', A2', A3', A4' partly include both coil sections from one of the first coil section systems C1, D1 and from one of the second coil section systems C2, D2.

Figure 7:
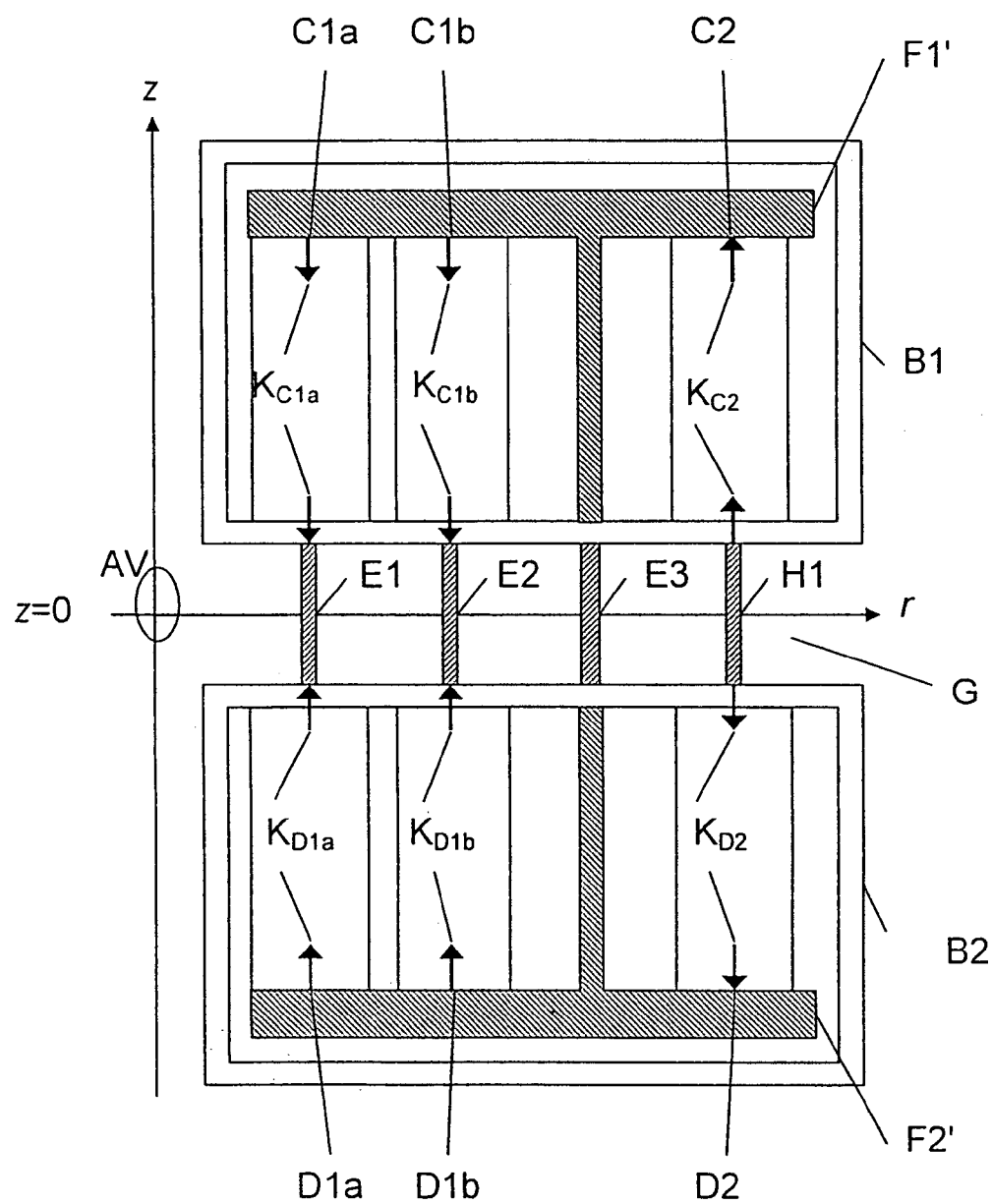
FIG. 7 shows a schematic vertical section through a radial half of a further inventive magnet arrangement.

FIG. 7 shows a further inventive magnet arrangement, wherein, in addition to the mechanical structures E1, E2 that withstand compressive loads and the structure H1 that withstands tensile loads, structures F1', F2' that withstand bending loads are also provided and mechanically connect, inside each of the containers B1, B2, the first coil section system C1, D1 to the respective second coil section system C2, D2, and support at least a part of the attractive magnetic forces $K_{C1a}$, $K_{C1b}$, $K_{D1a}$, $K_{D1b}$ and of the repulsive magnetic forces $K_{C2}$, $K_{D2}$. The split contains an additional mechanical structure that withstands compressive loads E3.

The invention is explained below using various embodiments of a superconducting, actively shielded magnet arrangement that produces a magnetic field of 10 Tesla in the working volume AV. The magnet is operated in two helium-filled containers B1, B2 at a temperature of 4.2 Kelvin. The superconducting material used is niobium-tin for the coil sections C1$a$ and D1$a$ and niobium-titanium for the coil sections C1$b$, C2, D1$b$, D2. The split G is 10 mm high ($z_{GC}=z_{GD}=5$ mm). For simplicity's sake, all coil sections have the same length ($za_{C2}-zi_{C2}=za_{C1b}-zi_{C1b}=za_{C1a}-zi_{C1a}=za_{D2}-zi_{D2}=za_{D1b}-zi_{D1b}=za_{D1a}-zi_{D1a}=120$ mm).

In a first embodiment (hereafter called "AF1"), the second coil section systems C2, D2 are mounted radially near to the first coil section systems C1, D1, wherein $ri_{C2}<1.3 \cdot ra_{C1b}$ and $ri_{D2}<1.3 \cdot ra_{D1b}$. Moreover, the distance between the winding package of the second coil section systems C2, D2 and the split G is greater than 12 mm ($zi_{D2}-z_{GD}=zi_{C2}-z_{GC}=15$ mm), while the winding packages of the first coil section systems are closer to the split ($zi_{C1a}-z_{GC}=zi_{C1b}-z_{GC}=zi_{D1a}-z_{GD}=zi_{D1b}-z_{GD}=10$ mm).

In a second embodiment (hereafter called "AF2"), the second coil section systems C2, D2 are radially further from the first coil section systems C1, D1, where $ri_{C2}>1.3 \cdot ra_{C1b}$ and $ri_{D2}>1.3 \cdot ra_{D1b}$. The distance between the winding packages and the split G is the same as in the first embodiment "AF1" ($zi_{D2}-z_{GD}=zi_{C2}-z_{GC}=15$ mm, $zi_{C1a}-z_{GC}=zi_{C1b}-z_{GC}=zi_{D1a}-z_{GD}=zi_{D1b}-z_{GD}=10$ mm).

In a third embodiment (hereafter called "AF3"), the second coil section systems C2, D2 are radially further from the first coil section systems C1, D1 as in the second embodiment AF2, wherein $ri_{C2}>1.3 \cdot ra_{C1b}$ and $ri_{D2}>1.3 \cdot ra_{D1b}$. However, the distance between the winding package of the second coil section systems C2, D2 and the split G is less than 12 mm and equal to the distance between the winding package of the first coil section systems C1, D1 and the split G ($zi_{D2}-z_{GD}=zi_{C2}-z_{GC}=zi_{C1a}-z_{GC}=zi_{C1b}-z_{GC}=zi_{D1a}-z_{GD}=zi_{D1b}-z_{GD}=10$ mm).

Table 1 shows a comparison of the most important characteristics of embodiments AF1, AF2, and AF3. To enable comparison between the three embodiments AF1, AF2, and AF3, they have been designed such that the magnetic field in the working volume and the 5 Gauss line $R_{5G}$, defined as the distance from the magnet axis from which the stray field strength falls below 5 Gauss, is the same in all cases. (Without shielding $R_{5G}=$approx. 2.2 m)

TABLE 1

|  | AF1 | AF2 | AF3 |
|---|---|---|---|
| B [T] | 10 | 10 | 10 |
| $J_{C1a} = J_{D1a}$ [A/mm$^2$] | 137 | 128 | 130 |
| $J_{C1b} = J_{D1b}$ [A/mm$^2$] | 264 | 247 | 249 |
| $J_{C2} = J_{D2}$ [A/mm$^2$] | −264 | −247 | −249 |
| $R_{5G}$ [m] | 0.72 | 0.71 | 0.72 |
| $ri_{C1a} = ri_{D1a}$ [mm] | 35 | 35 | 35 |
| $ra_{C1a} = ra_{D1a}$ [mm] | 78.5 | 78.5 | 78.5 |
| $ri_{C1b} = ri_{D1b}$ [mm] | 83 | 83 | 83 |
| $ra_{C1b} = ra_{D1b}$ [mm] | 122.1 | 122.1 | 122.1 |
| $ri_{C2} = ri_{D2}$ [mm] | 152 | 167 | 167 |
| $ra_{C2} = ra_{D2}$ [mm] | 170.8 | 182.7 | 182.7 |
| $zi_{C1a} = zi_{D1a}$ [mm] | 15 | 15 | 15 |
| $za_{C1a} = za_{D1a}$ [mm] | 135 | 135 | 135 |
| $zi_{C1b} = zi_{D1b}$ [mm] | 15 | 15 | 15 |
| $za_{C1b} = za_{D1b}$ [mm] | 135 | 135 | 135 |
| $zi_{C2} = zi_{D2}$ [mm] | 20 | 20 | 15 |
| $za_{C2} = za_{D2}$ [mm] | 140 | 140 | 135 |

In Table 1, $J_{kj}$ (k=C, D; j=1a, 1b, 2) denotes the current density in coil kj.

For the three embodiments AF1, AF2, and AF3, Table 2 shows the calculated axial magnetic forces of all coil sections acting on the coil section system D2 in [kN] in the operating state

TABLE 2

|  | AF1 | AF2 | AF3 |
|---|---|---|---|
| $K_{C1a \leftrightarrow D2}$ | −62 | −42 | −44 |
| $K_{C1b \leftrightarrow D2}$ | −343 | −238 | −252 |
| $K_{C2 \leftrightarrow D2}$ | 319 | 222 | 257 |
| $K_{D1a \leftrightarrow D2}$ | −7 | −4 | 0 |
| $K_{D1b \leftrightarrow D2}$ | −51 | −30 | 0 |
| $K_{D2}$ | −144 | −92 | −39 |

In Table 2, $K_{kj \Leftrightarrow D2}$ (k=C, D; j=1a, 1b, 2) denotes the contribution of the axial force on D2 that results from coil kj.

A comparison of variant AF2 with variant AF1 shows that increasing the distance between the first and second coil section systems can considerably reduce the repulsive magnetic forces. In the example, the magnetic forces on D2 are approximately 40% lower for an increase of approximately 50% in $ri_{C2} - ra_{C1b}$ and $ri_{D2} - ra_{C1b}$.

A comparison of variant AF3 with variant AF2 shows that positioning the second coil section systems C2, D2 axially closer to the split G, can considerably reduce the magnetic forces. In the case of an axial shift of C2 or D2 by 5 mm toward the split G, in the example, the repulsive contributions to the total force $K_{D2}$ ($K_{C1a \Leftrightarrow D2} + K_{C1b \Leftrightarrow D2} + K_{D1a \Leftrightarrow D2} + K_{D1b \Leftrightarrow D2}$) are slightly reduced (−6%) while the attractive contribution to the total force $K_{D2}$ ($K_{C2 \Leftrightarrow D2}$) greatly increases (+16%). Overall, the resulting repulsive force $K_{D2}$ is reduced by a factor of 2.

According to prior art, only a structure E that withstands compressive loads is provided in the split to support the resulting magnetic forces ($K_C = K_{C1a} + K_{C1b} + K_{C2}$, $K_D = K_{D1a} + K_{D1b} + K_{D2}$). For embodiment AF3, 4 rods with a diameter of 32 mm and a maximum permissible stress of 200 N/mm² could support the resulting magnetic forces in the operating state ($K_C = -K_D = 162$ kN+527 kN−39 kN=650 kN). In each container B1 and B2, the magnetic forces $K_{C1a}$, $K_{C1b}$, $K_{C2}$ or $K_{D1a}$, $K_{D1b}$, $K_{D2}$ respectively between the first and second coil section systems C1 or C2 and D1 or D2 would each be supported by one rigid structure F1 or F2. However, these structures F1, F2 would be also be subject to bending loads and would have to be dimensioned accordingly. For the embodiment AF3, six 30 mm wide beams could support these forces. To prevent the maximum permissible bending stress of 200 N/mm² from being exceeded in the operating state, these beams would have to be at least 80 mm thick, if they were supported using a ring between C1b and C2 or D1b and D2 respectively. This is because, a torque of around 6000 N*m would appear at the support point of each beam. The real problem is now that no mechanical structure in the available space would be able to transmit such a large torque to the ring. This example clearly shows that a coil system of variant AF3 could not be built by conventional methods.

According to the invention, the split G contains two mechanical structures E1 and E2 to support the attractive magnetic forces $K_{C1a}$ and $K_{D1a}$ or $K_{C1b}$ and $K_{D1b}$ respectively, and one structure H1 to support the repulsive magnetic forces $K_{C2}$, $K_{D2}$. These structures are exclusively subject to compressive and tensile loads, not bending loads, apart from the very small bending stresses that result from possible differing coefficients of thermal expansion between containers B1, B2 and the structure H1, if the magnet arrangement is cooled to a low operating temperature (typically 4.2 K in the case of a superconducting magnet arrangement).

In an inventive embodiment for neutron scattering, the mechanical structures E1, E2, H1 that withstand compressive and tensile loads consist, for example, of thin aluminum rings. Aluminum is chosen for the structures in the split because of the low interaction between the neutrons and aluminum. In this way, the neutrons can be scattered almost unhindered 360 degrees around the working volume. For embodiment AF3, three thin rings each with a maximum permissible stress of 200 N/mm² can support the magnetic forces in the operating state. These rings must have thicknesses of at least 2.3 mm, 4.1 mm and 0.2 mm and be positioned at $r_{E1} = (ra_{C1a} + ri_{C1a})/2 = 56.75$ mm, $r_{E2} = (ra_{C1b} + ri_{C1b})/2 = 102.55$ mm, $r_{H1} = (ra_{C2} + ri_{C2})/2 = 174.85$ mm.

The mechanical structures E1, E2 that withstand compressive loads are inserted in the split G without screws. The mechanical structure H1 that withstands tensile loads is connected to containers B1, B2 either by a material bond or a form-locked connection. For example, it is possible to use a total of sixteen M8 screws (5 kN per screw), having adjusted the thickness and geometry of H1 accordingly.

The advantage of the inventive arrangement is that inside the container no rigid structure is required to interconnect the coil section systems to support the magnetic forces in the coil systems. The mechanical structure is therefore less expensive, simpler, more space-saving and weight-saving.

To reduce the volume of the mechanical structure in the split, it is possible to use radially between the first coil section systems and the second coil section systems additional structures that withstand bending loads in order to support a part of the attractive and repulsive magnetic forces (see FIG. 7). This both enables a reduction in the quantity of material in the split and the structures that withstand bending loads can be dimensioned thinner than 80 mm (prior art), leaving more space for liquid coolant inside the containers, or the containers can be dimensioned smaller, making the magnet arrangement more compact.

In one inventive embodiment, steel is chosen for the containers because of its good mechanical properties. In this way, the containers B1 and B2 can be equipped with thin walls at the split. Because a material bonding method cannot easily join aluminum and steel, it is advantageous to screw together the structure that mechanically withstands tensile loads H1 and the containers B1, B2. A screw connection also permits simple assembly and non-destructive disassembly of the structure H1.

If the magnet arrangement is cooled to a low operating temperature (typically 4.2 K in the case of a superconducting magnet arrangement), the aluminum rings will contract much more than the steel containers because the absolute value of the difference between the relative thermal linear expansion and contraction of steel and aluminum on reaching an operating temperature of 4.2 K is greater than 0.1%. For the embodiment AF3, the aluminum ring H1 would contract radially by 0.7 mm on cooling while the containers B1 and B2 would shift radially inward only by 0.5 mm. Without additional measures, the screws that join the aluminum ring H1 to the container B1 or B2 would be placed under heavy stress.

To avoid such forces on the screws, according to the invention it is possible to split the aluminum ring H1 into multiple elements by means of slits (see FIG. 3). If an element is fixed with just one screw, the screws are not subject to any lateral forces on cooling. Alternately, the aluminum ring can be formed in such a way that sub-regions of this structure can be tangentially deformed, as soon as parts bordering the structure are subject to deformations perpendicular to the direction of the z axis (see FIG. 4).

In neutron scattering experiments with polarized neutrons, zero field nodes in the vicinity of the plane z=0 are unwanted because polarized neutrons would lose their spin orientation there. In the embodiment AF3, there is a zero field node at (r,z)=(106 mm, 0 mm), when all coils of the magnet arrangement are carrying the same current. This zero field node can be shifted both axially and radially out of the split by distributing the coils over two current paths that can carry different currents in the operating state.

In accordance with the invention, the aim is to prevent the magnetic forces and stray fields from becoming too large if different currents are flowing through different current paths.

In a conventional wiring diagram of embodiment AF3 (see FIG. 5), the second current path P2 includes the coil section D1$b$. If the second current path P2 is loaded with ⅔ of the current in P1, the zero field node shifts to (r,z)=(102 mm, −7 mm) outside of the split. In that way, 8.7 Tesla can be produced in the working volume AV; the 5 G line however is twice the distance from the working volume AV ($R_{5G}$=1.33 m) than in the symmetrical operating state. Force $K_{C2}$ is now attracting toward the split ($K_{C2}$=−45 kN) because the repulsive component $K_{D1b \leftrightarrows C2}$ has become smaller. Force $K_{D2}$ is still showing away from the split ($K_{D2}$=−39 kN). Structure H1 would, in this case, be under a compressive instead of under a tensile load. To operate the inventive magnet arrangement with these parameters, too, the structure H1, H1' that withstands tensile loads would also have to withstand compressive loads.

In an inventive wiring diagram of the embodiment AF3 (see FIG. 6), the second current path P2' includes coils D1$b$ and D2. If the second current path P2' is loaded with ⅔ of the current in P1', the zero field node is shifted to (r,z)=(105 mm, −6 mm) outside of the split. In that way, 9.1 Tesla can be produced in the working volume AV and the 5 G is only 20% further away from the working volume AV than in the symmetrical operating state ($R_{5G}$=0.88 m). Forces $K_{C2}$ and $K_{D2}$ are still showing away from the split ($K_{C2}$=41 kN, $K_{D2}$=−26 kN). $K_{C2}$ is only slightly greater than in the symmetrical operating state because the components of forces $K_{D2 \leftrightarrows C2}$ and $K_{D1b \leftrightarrows C2}$ are approximately equal in absolute value but show in opposite directions (see Table 2). The sum of the forces between D2 and C2 is therefore very small for each current in the current path P2'.

According to the invention, the aim is also to prevent the magnetic forces from increasing excessively in case of quenching.

Each coil C1$a$, C1$b$, D1$a$, D1$b$, C2, D2 is conventionally protected with its own protection element (see FIG. 5), for example, with the protection resistances R1, R2, R3, R4, R5, R6.

According to the invention, parts of a second coil section system C2, D2 and coil sections C1$a$, C1$b$, D1$a$, D1$b$ of a first coil section system C1, D1 are connected together in series and in parallel with a common protection element as a protection section A1', A2', A3', A4' (see FIG. 6), for example, with protection resistors R1', R2', R3', R4'. In practice, a finer coil subdivision would be preferred but the division into a total of six or four protection sections is a simple arrangement that already permits discussion of the problem of the forces in case of quenching and presentation of the inventive solution to the problem.

Table 3 shows, for embodiment AF3, the current densities in the coil sections, the magnetic forces acting on the coil section system C2, and the distance of the 5 G line from the working volume AV two seconds after quenching starts in the coil section system D2. In the simulations, all protection resistors R1, R2, R3, R4, R5, R6, R1', R2', R3', R4' are set to 0.5 ohm and it is assumed that the resistance of the coil system D2 rises linearly within 3 seconds from 0 ohm to 13.8 ohm. The force $K_{C2}$ is therefore at a maximum approx. 2 seconds after the start of quenching.

TABLE 3

| AF3 | Operating state | 2 s after quenching Conventional wiring according to FIG. 5 | 2 s after quenching Inventive wiring according to FIG. 6 |
|---|---|---|---|
| $J_{C1a}$ [A/mm$^2$] | 130 | 118 | 150 |
| $J_{C1b}$ [A/mm$^2$] | 249 | 240 | 261 |
| $J_{C2}$ [A/mm$^2$] | −249 | −272 | −261 |
| $J_{D1a}$ [A/mm$^2$] | 130 | 119 | 228 |
| $J_{D1b}$ [A/mm$^2$] | 249 | 188 | 37 |
| $J_{D2}$ [A/mm$^2$] | −249 | −16 | −37 |
| $K_{D1a \to C2}$ [kN] | 44 | 45 | 81 |
| $K_{D1b \to C2}$ [kN] | 252 | 208 | 39 |
| $K_{D2 \to C2}$ [kN] | −257 | −17 | −40 |
| $K_{C1a \to C2}$ [kN] | 0 | 0 | 0 |
| $K_{C1b \to C2}$ [kN] | 0 | 0 | 0 |
| $K_{C2}$ [kN] | 39 | 236 | 80 |
| $R_{5G}$ [m] | 0.72 | 1.8 | 1.4 |
| Number of M8 screws for H1, H1' | 16 | 96 | 32 |

Without further measures, the conventional protection concept involves the risk of a massive increase in the magnetic forces, if quenching starts in the coil section system D2 that is not immediately thermally transmitted to the coil section system C2. In this case, the attractive component $K_{D2 \leftrightarrows C2}$ of the force on C2 is absent for a short time. This means the repusive forces $K_{C2}$ are around 6 times greater than in the operating state two seconds after the start of quenching. To be able to support such forces, at least 96 M8 screws are needed (instead of 16 screws) to fix the structure that withstands tensile loads H1, H1' to the containers B1 and B2.

This risk is eliminated with the protection concept presented in FIG. 6 because coil section D1$b$ discharges together with coil section system D2. This causes the attractive component $K_{D2 \leftrightarrows C2}$ of the force acting on C2 and the repulsive component $K_{D1b \leftrightarrows C2}$ of the force acting on C2 to vanish simultaneously. The forces showing away from the split G on the coil section system C2 are still 2 times greater than in the operating state, which is due to overcharging of coil section D1$a$. To be able to support such forces, at least 32 M8 screws are required to fix the structure that withstands tensile loads H1, H1' to the containers B1 and B2.

The stray fields during quenching of the coil section system D2 can also be better suppressed with the inventive protection concept according to FIG. 6 ($R_{5G}$=1.4 m instead of $R_{5G}$=1.8 m two seconds after the start of quenching). With optimization of the protection concept, it would be possible to reduce this value still further.

LIST OF REFERENCE SYMBOLS

A1-A6, A1'-A4' Protection sections
AV Working volume
B1, B2 Containers
C, D Coil systems
C1, D1 First coil section systems
C1$a$, C1$b$, D1$a$, D1$b$ Coil sections of the first coil section systems
C2, D2 Second coil section systems
E, E1, E2, E3 Mechanical structures that withstand compressive loads
F1, F2, F1', F2' Rigid structure inside the containers
G Split
H1, H1' Structures that withstand tensile loads $K_C$, $K_D$, $K_{C1}$, $K_{C1'}$ Attractive magnetic forces showing toward the split $K_{C1a}$, $K_{C1b}$, $K_{D1a}$, $K_{D1b}$ $K_{C2}$, $K_{D2}$ Repusive magnetic forces showing away from the split M Magnet coil system P1, P2, P1', P2' Superconducting current paths R1-R6, R1'-R4' Protection elements $ra_{kj}$ Outer radii of the coil sections (k=C, D; j=1a, 1b, 2)

$r_{E1}$, $r_{E2}$, $r_{H1}$ Central radii of the structures E1, E2, H1

$ri_{kj}$ Inner radii of the coil sections (k=C, D; j=1a, 1b, 2)

$RP_{0.2}$ Mechanical stress in a state of 0.2% plastic strain.

S1, S2, S1', S2' Superconducting switches

T1 Solid sub-regions of the structure that withstands tensile loads

T2 Deformable sub-regions of the structure that withstands tensile loads $za_{kj}$ Distance of the upper edge of the winding package of the coil kj from z=0 (k=C, D; j=1a, 1b, 2)

$z_{GC}$, $z_{GD}$ Distance of the plane z=0 from containers B1 and B2

$zi_{kj}$ Distance of the lower edge of the winding package of the coil kj from z=0 (k=C, D; j=1a, 1b, 2)

LIST OF REFERENCES

1 U.S. Pat. No. 6,717,408 B2
2 G. Claudet et al., Cryogenics, Vol. 21, No. 12, December 1981, pages 711-714
3 JP2001230114
4 C. Minas and E. T. Laskaris, IEEE Transactions on Applied Superconductivity, Vol. 5, No. 2, June 1995, pages 173-176
5 E. T. Laskaris et al., IEEE Transactions on Applied Superconductivity, Vol. 5, No. 2, June 1995, pages 163-168
6 U.S. Pat. No. 5,291,169
7 EP 0 971 240A2

We claim:

1. A magnet arrangement for producing a magnetic field in a direction of a z axis in a working volume located on the z axis about z=0, the arrangement comprising:
    a first container disposed about the z-axis;
    a second container disposed about the z-axis at an axial separation from said first container to define a split;
    a first coil system disposed in said first container, said first coil system having a first coil section comprising a first coil body and a first winding package and a second coil section comprising a second coil body and a second winding package;
    a second coil system disposed in said second container, said second coil system having a third coil section comprising a third coil body and a third winding package, wherein said first and said third coil sections are exposed to attractive magnetic forces acting in an axial direction towards said split and said second coil section is exposed to repulsive magnetic forces acting in the axial direction away from the split, said magnetic forces being at least partially mechanically transmitted to said first and said second containers;
    a first mechanical structure disposed in said split to withstand compressive loads and to support at least part of said attractive magnetic forces; and
    a second mechanical structure disposed radially within said split within dimensions of said first and said second containers to mechanically withstand tensile loads in a z-direction and to at least partially support said repulsive magnetic forces acting in said axial direction, said second mechanical structure connected to and holding together said first and said second containers.

2. The magnet arrangement of claim 1, wherein a largest angular range about the z axis without contact points between said second mechanical structure and said first and said second containers is less than or equal to 180°.

3. The magnet arrangement of claim 1, wherein said second mechanical structure is connected to said first and second containers by a material bond.

4. The magnet arrangement of claim 1, wherein said second mechanical structure is connected to said first and second containers by a form-locked connection.

5. The magnet arrangement of claim 1, wherein said first coil body, said second coil body, said third coil body, said second mechanical structure, said first container and said second container are all made of a same material.

6. The magnet arrangement of claim 1, wherein said first coil body, said second coil body, said third coil body, said second mechanical structure, said first container and said second container are made from at least two different materials.

7. The magnet arrangement of claim 6, wherein absolute value of a difference between a relative thermal linear expansion of at least two of said different materials on reaching an operating temperature, that differs from a temperature during mechanical assembly of the magnet arrangement, is less than 0.1%.

8. The magnet arrangement of claim 6, wherein said second mechanical structure comprises multiple segments that are arranged about said z-axis, said segments being azimuthally spaced with respect to one another.

9. The magnet arrangement of claim 6, wherein said second mechanical structure comprises at least one first, non-deformable sub-region and at least one further sub-region that is deformable in a direction perpendicular to said z axis.

10. The magnet arrangement of claim 1, further comprising at least one third mechanical structure that withstands bending loads, said third structure being mechanically connected to said first coil section, said second coil section, and said third coil section to support at least a part of said attractive and said repulsive magnetic forces.

11. The magnet arrangement of claim 1, wherein said second coil section is radially arranged outside said first coil section to compensate for at least 50% of a magnetic dipole moment of said first coil section.

12. The magnet arrangement of claim 1, wherein said first and said second coil systems have a same mechanical and geometric structure and are positioned in said first and second containers symmetrically with respect to a plane that is perpendicular to said z axis and intersects it at height z=0.

13. The magnet arrangement of claim 1, wherein said first and said second coil systems have different mechanical and geometric structures and/or are positioned in said first and said second containers asymmetrically with respect to a plane that is perpendicular to said z axis and intersects it at height z=0.

14. The magnet arrangement of claim 1, wherein an inner radius of said second coil section is greater than 1.3 times an outer radius of said first coil section or said third coil section.

15. The magnet arrangement of claim 1, wherein a distance between said second winding package and said split is less than 12 mm.

16. The magnet arrangement of claim 1, wherein at least one of said first, second, and third coil sections are at least partly superconducting.

17. The magnet arrangement of claim 16, wherein at least portions of said first, second or third coil sections are connected in series as a protection section, wherein said protection section is connected in parallel with a common protection element.

18. The magnet arrangement of claim 17, wherein, in an operating state of at least one protection section, magnetic dipole moments of said parts of said second coil section compensate for at least 50% of a magnetic dipole moment of said parts of said first coil section.

19. The magnet arrangement of claim 16, wherein at least parts of said second coil section, said first coil section, or said third coil section inside a superconducting current path, are connected together in series and in parallel with a superconducting switch.

20. The magnet arrangement of claim 19, wherein, in an operating state of said superconducting current path, magnetic dipole moments of said parts of said second coil section compensate for at least 50% of magnetic dipole moments of said parts of said first coil section.

21. The magnet arrangement of claim 1, wherein said first and second containers are filled with liquid coolants.

22. The magnet arrangement of claim 1, further comprising a device for active cooling of said first and said second containers.

23. The magnet arrangement of claim 1, wherein the magnet arrangement is part of an apparatus for neutron scattering, X-ray scattering, or MRI.

* * * * *